US008858700B2

(12) United States Patent
Endoh et al.

(10) Patent No.: US 8,858,700 B2
(45) Date of Patent: Oct. 14, 2014

(54) BONDING MATERIAL USING METAL NANOPARTICLES COATED WITH C6-C8 FATTY ACIDS, AND BONDING METHOD

(75) Inventors: Keiichi Endoh, Okayama (JP); Aiko Nagahara, Okayama (JP); Yutaka Hisaeda, Okayama (JP); Toshihiko Ueyama, Okayama (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/381,731

(22) PCT Filed: Oct. 23, 2009

(86) PCT No.: PCT/JP2009/005609
§ 371 (c)(1),
(2), (4) Date: Dec. 30, 2011

(87) PCT Pub. No.: WO2011/007402
PCT Pub. Date: Jan. 20, 2011

(65) Prior Publication Data
US 2012/0103515 A1    May 3, 2012

(30) Foreign Application Priority Data
Jul. 14, 2009  (JP) ................................ 2009-166167

(51) Int. Cl.
*B29C 65/02*  (2006.01)
*B32B 37/06*  (2006.01)
(Continued)

(52) U.S. Cl.
CPC ......... *B23K 35/3006* (2013.01); *B22F 2999/00* (2013.01); *H01L 2924/014* (2013.01); *B23K 35/22* (2013.01); *B23K 35/365* (2013.01); *H01L*
(Continued)

(58) Field of Classification Search
USPC ............ 428/403; 106/403, 505; 256/279, 320
See application file for complete search history.

(56) References Cited

U.S. PATENT DOCUMENTS 8,313,800 B2 *  11/2012  Shiraishi et al. .............. 427/212
2004/0245648 A1  12/2004  Nagasawa et al.
(Continued)

FOREIGN PATENT DOCUMENTS

CN            101208173        6/2008
EP             1107298         6/2001
(Continued)

OTHER PUBLICATIONS

Toshiaki Morita et al., "Bonding Technique Using Micro-Scaled Silver-Oxide Particles", Japan Institute of Electronics Packaging, vol. 12, No. 2., 2009, pp. 110-113.
(Continued)

*Primary Examiner* — Holly Le
(74) *Attorney, Agent, or Firm* — Greenblum & Bernstein, P.L.C.

(57) ABSTRACT

In a bonding material using nanoparticles and a bonding method, use in combination with microparticles is proposed. However, there is the problem in which it is not easy to uniformly mix the nanoparticles and the microparticles. The present invention uses a bonding material including metal nanoparticles having an average particle diameter of 100 nm or less and a surface coated with an organic substance having 6 to 8 carbon atoms, and a polar solvent in an amount of 5 to 20% by mass with respect to a powder of the metal nanoparticles, and objects to be bonded with the bonding material interposed therebetween are fired at 200 to 350° C. under pressure. Thus, the metal nanoparticles are melted and returned to a bulk material, and therefore a bonding layer of the bulk material can be formed at a low temperature equal to or lower than a melting point.

7 Claims, 4 Drawing Sheets

(51) Int. Cl.
*C08K 3/08* (2006.01)
*C08K 5/09* (2006.01)
*B23K 35/22* (2006.01)
*B23K 35/365* (2006.01)
*B23K 35/02* (2006.01)
*B22F 1/00* (2006.01)
*B82Y 30/00* (2011.01)
*B23K 35/40* (2006.01)
*H01L 23/00* (2006.01)
*B23K 35/30* (2006.01)

(52) U.S. Cl.
CPC ......... 2224/2919 (2013.01); *H01L 2924/13055* (2013.01); *H01L 2924/13091* (2013.01); *B23K 35/0244* (2013.01); *H01L 2924/01047* (2013.01); *B22F 1/0018* (2013.01); *H01L 2924/01023* (2013.01); *B82Y 30/00* (2013.01); *H01L 2924/01082* (2013.01); *H01L 2924/01019* (2013.01); *H01L 2924/01013* (2013.01); *H01L 2924/0105* (2013.01); *H01L 2924/01033* (2013.01); *H01L 2224/29* (2013.01); *H01L 2924/01029* (2013.01); *H01L 2224/29339* (2013.01); *B23K 35/40* (2013.01); *B22F 1/0062* (2013.01); *H01L 2924/01004* (2013.01); *H01L 24/29* (2013.01); *H01L 2224/8384* (2013.01); *H01L 2924/01005* (2013.01); *H01L 2924/01006* (2013.01); *H01L 2224/2929* (2013.01); *H01L 2924/0665* (2013.01); *H01L 2924/00013* (2013.01); *H01L 24/83* (2013.01); *H01L 2224/29101* (2013.01)
USPC ........... 106/403; 106/505; 156/279; 156/320; 428/403

(56) References Cited

U.S. PATENT DOCUMENTS

| | | | |
|---|---|---|---|
| 2006/0145125 A1* | 7/2006 | Kuwajima et al. | 252/500 |
| 2006/0199008 A1* | 9/2006 | Sato | 428/402 |
| 2009/0162557 A1* | 6/2009 | Lu et al. | 427/383.3 |
| 2009/0258202 A1* | 10/2009 | Sakaguchi et al. | 428/206 |
| 2009/0301606 A1 | 12/2009 | Ueshima | |
| 2010/0224837 A1* | 9/2010 | Wu et al. | 252/514 |
| 2010/0243967 A1 | 9/2010 | Hisaeda et al. | |
| 2011/0155968 A1 | 6/2011 | Iha et al. | |
| 2011/0253949 A1 | 10/2011 | Kaneda et al. | |
| 2011/0272642 A1 | 11/2011 | Hisaeda et al. | |
| 2011/0278508 A1 | 11/2011 | Hisaeda et al. | |
| 2012/0298009 A1* | 11/2012 | Endoh et al. | 106/287.18 |
| 2013/0081759 A1* | 4/2013 | Endoh et al. | 156/326 |
| 2013/0323529 A1* | 12/2013 | Kurita et al. | 428/613 |

FOREIGN PATENT DOCUMENTS

| | | | |
|---|---|---|---|
| EP | 1 578 559 B1 | | 3/2009 |
| JP | 2004-130371 A | | 4/2004 |
| JP | 2008-161907 A | | 7/2008 |
| JP | 2008-166086 A | | 7/2008 |
| JP | 2009-120923 A | | 6/2009 |
| JP | 2009-138243 A | | 6/2009 |
| WO | WO 95/20460 | * | 8/1995 |
| WO | 2004/026526 A1 | | 4/2004 |
| WO | WO 2004026526 A1 | * | 4/2004 |

OTHER PUBLICATIONS

International Search Report for PCT/JP2009/005609, Dated: Jan. 19, 2010.

* cited by examiner

BONDING MATERIAL USING METAL NANOPARTICLES COATED WITH C6-C8 FATTY ACIDS, AND BONDING METHOD

TECHNICAL FIELD

The present invention relates to a bonding material for bonding articles using metal nanoparticles and a bonding method using the same.

BACKGROUND ART

When the size of a solid substance is in the order of nanometers (10-9 m), it has been known that properties thereof are varied largely (hereinafter, metal particles having a size of the order of nanometers are referred to as "metal nanoparticles") as compared with an object having a size enough to be observable (hereinafter referred to as "bulk material"). In particular, it has been known that the melting point of metal particle powder is dramatically lowered when compared with that of the bulk material.

Therefore, a substance which can be melted only at high temperatures in a state of bulk material is expected that metal nanoparticles are melted by heating at relatively low temperatures (up to about 350° C.) and bound to form metal bonding between the substances.

In this technique, it is notable that the metal nanoparticles are melted once to become a bulk material, the bulk material is melted again at the temperature given during a bonding process, and thus peeling cannot occur. That is, when metal originally having a high melting point as a bulk material is utilized for melt bonding as particles having a size of the order of nanometers, the metal can be bonded at low temperatures during the bonding process. At the same time, since the melting point of a bonded portion after the process is near the melting point of the bulk material, a bonding body having high bonding stability can be obtained even when the bonding body is used in an environment at high temperatures. Further, in a substance having a metal species with low ionization tendency, problems of deterioration with age caused by oxidation are unlikely to occur. Accordingly, there is a high demand in applications requiring high reliability.

As a technique disclosed in this field, there has been a literature in which silver oxide microparticles are dispersed in mirystil alcohol, and heated in air to bond substances (see Non-Patent Literature 1). This is a technique in which the alcohol is used to promote properties in which silver oxide is only heated in air to be actively reduced into metal. Further, Patent Literature 1 describes a specific example of this bonding method.

Moreover, Patent Literature 2 discloses that practical bonding strength can be obtained through a bonding method in which particles having different particle diameters are mixed and then heated under pressure.

PRIOR ART LITERATURE

Patent Literatures

Patent Literature 1: Japanese Patent Application Laid-Open No. 2008-166086
Patent Literature 2: Japanese Patent Application Laid-Open No. 2008-161907

Non-Patent Literatures

Non-Patent Literature 1: Morita et al., "Bonding Technique Using Micro-Scaled Silver-Oxide Particles", Japan Institute of Electronics Packaging, pp. 110, Vol. 12, No. 2 (2009)

SUMMARY OF INVENTION

Problem to be Solved by the Invention

According to the technique in Patent Document 2, silver particles which have a large particle diameter and are coated with an organic compound having 2 to 8 carbon atoms and other silver particles having a different particle diameter are used in combination. Accordingly, bonding using particles having a size of the order of nanometers and particles having a size of the order of micrometers in combination is disclosed. When metal nanoparticles are used alone, sufficient bonding cannot be achieved.

It is believed that this is because, when particles having a small particle diameter are filled into spaces between particles having a large particle diameter, the filling density of particles used for bonding can be increased more than that of small particles alone, and bonding can occur efficiently. Accordingly, in order to achieve high bonding strength in the conventional technique, it is found that use of particles having a size of the order of micrometers in combination with nanoparticles is recommended.

However, the particles having a size of the order of micrometers (hereinafter referred to as "microparticles") and the nanoparticles are different in a production method, and it is not easy that the respective particles in a desired ratio are produced simultaneously in the same reaction furnace. In addition, when microparticles and nanoparticles are mixed in a desired ratio, the microparticles become nuclei and the nanoparticles aggregate therearound. Therefore, it may not be easy to mix the particles stably. Therefore, an object of the present invention is to obtain a bonding material capable of ensuring high bonding strength using nanoparticles alone.

Means for Solving the Problem

In view of such problems, the present invention provides a bonding material using silver nanoparticles having a surface coated with an organic substance having 6 to 8 carbon atoms, and a bonding method using the same.

Specifically, the present invention provides a bonding material including metal nanoparticles having an average particle diameter of 100 nm or less and a surface coated with an organic substance having 6 to 8 carbon atoms, and a polar solvent in an amount of 5 to 20% by mass with respect to the metal nanoparticles.

Further, a dispersant may be added to this bonding material.

Moreover, as the metal nanoparticles, a mixture of two or more kinds of metal nanoparticles coated with different organic substances may be used. That is, a mixture of metal nanoparticles coated with an organic substance and metal nanoparticles coated with another organic substance in a predetermined ratio may be used.

Further, it is preferable that one of the organic substances be an unsaturated fatty acid. Although the reason is unknown, it is considered that during the production, double bond portions are separated due to a catalytic function of the nanoparticles, the double bonds are bound with each other, and the nanoparticles can be retained orderly.

The present invention provides a bonding method including a step of applying a bonding material in which metal nanoparticles having an average particle diameter of 100 nm or less and a surface coated with an organic substance having 6 to 8 carbon atoms are dispersed in a polar solvent to an adherend, a first heating step of performing heating at a temperature equal to or lower than a sintering temperature of the metal nanoparticles while an object to be adhered is brought into contact with the adherend under pressure, and a second heating step of performing heating at a heating temperature of 200° C. or higher and 350° C. or lower. In this case, however, the bonding material may be applied to either or both of an object to be bonded and a bonding object.

Further, the bonding method of the present invention is a bonding method including a step of applying a bonding material in which metal nanoparticles having an average particle diameter of 100 nm or less and a surface coated with an organic substance having 6 to 8 carbon atoms are dispersed in a polar solvent to a bonding face and a face to be bonded, a step of drying the bonding face and the face to be bonded at a temperature equal to or lower than a sintering temperature of the metal nanoparticles, and a heating step of making the bonding face butt the face to be bonded and heating them at 200° C. or higher and 350° C. or lower under pressure.

Furthermore, the bonding method of the present invention is the bonding method, wherein a retention time in the first heating step is 30 seconds or more and 30 minutes or less, and a retention time in the second heating step is 30 seconds or more and 60 minutes or less.

Further, the bonding method of the present invention is the bonding method according to the above-described structure, wherein the metal nanoparticle is a silver nanoparticle.

Effect of the Invention

In the bonding material of the present invention, only metal nanoparticles having an average particle diameter of 100 nm or less is used. For this reason, since the bonding material is melted at a temperature much lower than the melting point of a bulk material, and metal bonding can be formed, a bonding body can be formed. Further, since as the organic substance with which a surface is coated, an organic substance having a comparatively small numbers of carbon atoms is used, the bonding material is decomposed and evaporated at a low temperature. Therefore, after firing, a bonding layer having the same strength as in a bonding layer made of a bulk material can be obtained.

BEST MODE(S) FOR CARRYING OUT THE INVENTION

The metal nanoparticles used in the present invention have an average primary particle diameter, which is calculated from transmission electron microscope photographs, of 100 nm or less, preferably 60 nm or less, and more preferably 10 nm to 30 nm. When the diameter of particles is within this range, a plurality of particles having different average particle diameters may be used together.

If the metal nanoparticle has very high activity and has a bare surface, adjacent particles may be adhered to each other or oxidized in air sometimes. Thus, the surface of the metal nanoparticle is coated with an organic compound to attempt enhancement in storage stability of the particles. However, in this case, if the molecular weight of the organic compound with which the surface is coated is large, even when the organic compound is heated at a low temperature, it is unlike to be decomposed or evaporated. In such a case, carbons in a bonding layer cannot be removed sufficiently, and as a result, this causes decrease in bonding strength.

In contrast, when the molecular weight of the organic substance with which the surface is coated is too small, the particles are unlikely to remain stable. Therefore, the particles are difficult to be handled. Accordingly, it is required that an organic substance having a molecular weight capable of achieving stability of the particles in metal nanoparticles and low-temperature sintering properties together be used to coat the surface of the particles. Based on such requirement, the present inventors have studied achievement of such properties, and have found that it is proper that carboxylic acid having 6 to 8 carbon atoms is used. Further, an organic substance is not particularly restricted to a structure as long as it is such an organic substance, and may have an aromatic ring (benzene ring) or an unsaturated bond. In particular, according to the studied results by the present inventors, it has been found that particles whose surface is coated with an organic substance that is a linear fatty acid and has an unsaturated bond can be used to increase adhesion strength.

In the present invention, in particular it is only necessary that among fatty acids, the organic substance has a carboxylic acid having 6 to 8 carbon atoms, or partially has a carboxylic acid as an aromatic compound. For example, the organic substance may be a substance in which one of the hydrogen atoms in benzoic acid is substituted with a hydroxyl group. Specifically, it is found that the organic substance is particularly preferably an organic substance having a steric hindrance effect of the degree equivalent to that of hexanoic acid, heptanoic acid, octanoic acid, sorbic acid, benzoic acid, salicylic acid, m-hydroxybenzoic acid, or p-hydroxybenzoic acid. Further, when the particle is a particle coated with such an organic substance, for example, a particle coated with hexanoic acid or sorbic acid, the particle is provided in a powder state depending on a reaction. Therefore, a particle suitable for storage stability and addition to other nanoparticle can be obtained. An aggregate of metal nanoparticles is sometimes referred to as powder or particle powder in the description.

Moreover, in the present invention, not only metal nanoparticles coated with one kind of organic substance but also a mixture of metal nanoparticles coated with different organic substances may be utilized. For example, a mixture of metal nanoparticles having a surface coated with a saturated fatty acid and metal nanoparticles having a surface coated with an unsaturated fatty acid may be utilized.

Further, it is preferable that the bonding material of the present invention be one in which metal nanoparticles having a surface coated with an organic substance are dispersed in a polar solvent. In particular, the use of the polar solvent is preferred because the polar solvent has a vapor pressure lower than that of a nonpolar solvent at the same temperature and is suitable for handling.

Since metal nanoparticles easily aggregate, a preferable structure is that a dispersant is added separately so as to be a stable dispersing state. The dispersant used herein is not particularly limited, and a usually known dispersant may be added.

Further, it is preferable that the bonding material of the present invention be provided in a paste state, whereby a bonding material having an appropriate viscosity facilitates application to a bonding portion. Moreover, it is more preferable that a material having an effect for decreasing the sintering temperature of the metal nanoparticles also have an effect for adjusting the viscosity. Finally, the bonding material of the present invention is provided to have a viscosity of 10 to 250 Pa·s (a value at 25° C., 5 rpm, C (Cone): 65/2) at normal temperature.

Subsequently, the bonding method using the bonding material of the present invention will be described. The bonding material is applied to a bonding portion in a thickness of about 10 to 200 μm through various printing methods, for example, a metal mask, a dispenser, or a screen printing method. Different from an ordinary adhesive or solder, the bonding material of the present invention after sintering is metal having the same melting point as in bulk, and therefore it is not very necessary that a bonding interface is made thin. This is because a bonding layer has the same hardness as in metal in bulk.

Figure 1:
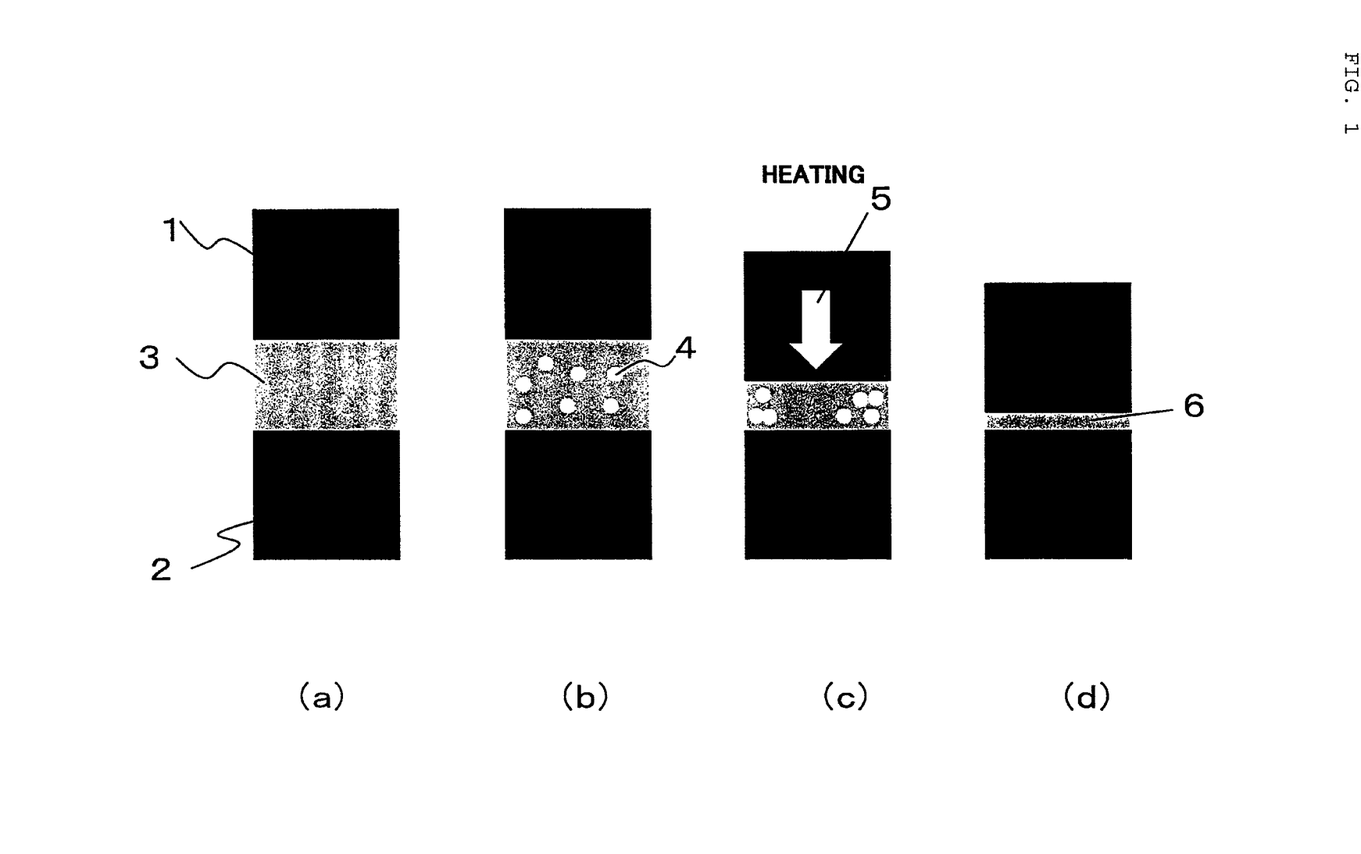
FIG. 1 is a pattern view showing a bonding process according to the present invention.

However, since the surfaces of metal nanoparticles in the bonding material of the present invention are coated with an organic substance, gases are generated during the separation or decomposition of these organic substances. FIG. 1 schematically shows a bonding process when the bonding material of the present invention is used. FIG. 1(a) shows a state in which a bonding material 3 is applied to between objects to be bonded 1 and 2. Further, a thin film layer may be formed on the surface of the object to be bonded to enhance wettability. The thin film layer can be formed, for example, through plating, vapor deposition, or sputtering, and coating metal species is not particularly limited. For example, a copper plate having a surface coated with silver can be used.

When this copper plate is heated, gases are generated due to the decomposition or separation of organic substances in a bonding material as bubbles 4 (see FIG. 1(b)). If these bubbles are left as-is, the strength of the bonding layer is decreased because of the above-described reason. Then, the object to be bonded is heated under pressure 5 to get the gases out of the bonding material (see FIG. 1(c)), and a bonding layer 6 in a bulk state is formed between the objects to be bonded (see FIG. 1(d)). The bonding layer 6 to be a bulk state exerts high adhesion properties and bonding strength. Further, when a pressure is applied, heating need not be performed.

As a pressurization method at this time, a method in which a load is simply applied above and below the bonding material is sufficient. In some cases, when a pressure is applied above and below the bonding material while an article is rotated or vibrated, the bubbles are likely to get out and adhesion properties may be improved. For this reason, the method can be properly modified. From the viewpoint of removing the bubbles, an air escape route may be formed on either of ends of pressurizing face as a preferable structure at this time.

Moreover, at this time, a higher pressure is usually preferable, but in the present invention a pressure need not be excessively applied. This is because the above-described structure of particles facilitates the decomposition of the organic substances with which the surface is coated to be changed into metal. When the objects to be bonded are metal, the sufficient pressure is about 5 MPa.

Next, a preliminary firing step is performed. The purpose thereof is to evaporate a solvent in the bonding material in a paste state. However, there is a fear of decomposing the organic substances on the surface of metal nanoparticles to be sintered. Therefore, a temperature equal to or lower than a decomposition temperature is suitable. Further, since the decomposition temperature itself can be easily confirmed by TG measurement, it is preferable that a firing temperature be measured in advance. In the preliminary firing step for sintering metal nanoparticles, heating is performed at a temperature at which metal does not start to be sintered under pressure to the bonding materials, that is, a temperature equal to or lower than the sintering temperature of metal. The retention time depends on the area of bonding part, and may be about 10 minutes, and a time as short as about 30 seconds. Herein, the firing temperature is a temperature at which metal nanoparticles are melted into a bulk state.

A temperature increase step may be performed between the preliminary firing step and a main firing step. The temperature-increase rate at this time is preferably within a range of 1 to 5° C./s.

Next, the main firing step is performed. In the main firing step, the bonding material retains at a temperature of 200° C. or higher and 350° C. or lower for 10 minutes under pressure. A firing step is thus separated into the preliminary firing step and the main firing step, and therefore the time of main firing step can be shortened. The time of main firing is 60 minutes or less, including a retention time after or before melting. Even when the time is 10 minutes or less depending on objects to be bonded, and further as short as 30 seconds, sufficient adhesion strength can be obtained.

Hereinafter, with regard to the bonding material of the present invention, the production method and the bonding method will be described in detail.

<Synthesis Method of Particles>

A silver fine particles-containing composition used in the present invention includes silver nanoparticles which are bound to a carboxylic acid having 6 to 8 carbon atoms or derivatives thereof. In such a structure, the silver fine particles in the composition do not aggregate during drying or dispersing them in a polar solvent, and can exist stably.

Herein, the carboxylic acid having 6 to 8 carbon atoms functions as a protective agent. This protective agent is adhered to the surfaces of silver particles to inhibit the binding of the particles with each other, and therefore has an effect for obtaining stable silver fine particles. As described above, it is suitable to use organic substances having a steric hindrance effect of the degree equivalent to that of hexanoic acid, heptanoic acid, pentanoic acid, sorbic acid, benzoic acid, or hydroxybenzoic acid.

Moreover, the silver fine particles-containing composition used in the present invention may contain a polar solvent, and silver fine particles may be dispersed in the polar solvent. As such a polar solvent, water or an organic solvent having a polar group can be used. Specific examples thereof include water, alcohol, polyol, 1-methylpyrrolidinone, pyridine, terpineol, diethylene glycol monobutyl ether, diethylene glycol monobutyl ether acetate γ-butyrolactone, ethylene glycol monomethyl ether acetate, ethylene glycol monoethyl acetate, methoxybutyl acetate, methoxypropyl acetate, diethylene glycol monoethyl ether acetate, ethyl lactate, and 1-octanol.

Subsequently, a method for producing silver fine particles used in the present invention will be described. The method for producing silver fine particles typically performs a preparation step of adjusting a raw material liquid and a reduction liquid, a temperature increase step of increasing temperature, a reaction step of adding the raw material liquid to the reduction liquid to advance a reaction, an aging step of growing metal particles (particularly silver particles) in the liquid, a washing step of repeating filtration, washing with water, and dispersion to remove extra organic substances, and a drying step of removing moisture in the solution through drying.

In the present invention, a reduction liquid preparation step, a silver reaction step, and a washing step are performed as follows. Specifically, the reduction liquid used in the reduction liquid preparation step includes water, aqueous ammonia, hexanoic acid (or sorbic acid, etc.), and an aqueous solution of hydrazine hydrate. In the silver reaction step, a silver nitrate aqueous solution is added to this reduction liquid to cause a reaction. In the washing step, a product obtained in the reaction step is washed with water.

Through these steps, silver particles exist stably in a polar solvent containing water to obtain silver nanoparticles with a diameter of 100 nm or less. Further, aqueous ammonia to be contained in the reduction liquid is added as a stabilizing agent in order to dissolve acids in water.

In the silver reaction step, it is preferable that the temperature of a reaction liquid in a reaction vessel be increased to a range of 40° C. to 80° C. to cause the reaction. Further, when the temperature is lower than 40° C., the degree of supersaturation of metal is increased to promote generation of nuclei. Therefore, the particle size distribution is likely to be uneven, and this is not preferable. Moreover, when the temperature exceeds 80° C., the generation of nuclei is suppressed, however it is difficult to control particle growth. Thus, large particles and small particles exist randomly, and this is not preferable, too.

Further, in the silver reaction step, from the viewpoint of realization of uniform reaction in the solution, it is preferable that the silver nitrate aqueous solution to be added be added at once. When the solution is not added at once, the solution becomes an uneven system, and the generation of nuclei and the aggregation of particles occur simultaneously. As a result, uneven silver particles having a large particle size distribution may be obtained. Accordingly, "added at once" used herein is not particularly limited as long as reaction factors such as concentration or pH of the reducing agent and the protective agent, and a temperature are not substantially changed depending on time of adding the silver nitrate aqueous solution.

Herein, the hydrazine hydrate may be one capable of reducing metal as a reducing agent. Reducing agents other than hydrazine hydrate, for examples, hydrazine, a hydrogenated boron alkali salt ($NaBH_4$, and the like), lithium aluminum hydride ($LiAlH_4$), ascorbic acid, primary amines, secondary amines, tertiary amines, and the like can be used in combination.

In order to control the shape of final particles, addition of a slight amount of copper to the solution is a suitable aspect. When the addition amount is too small, effects are not available. Further, the addition of a large amount of copper does not influence the shape of particles, resulting in many impurities existing in the system. This is not suitable. At this time, the addition amount of copper is preferably 0.5 ppm or more and less than 1000 ppm, and more preferably 0.5 ppm or more and less than 500 ppm.

Next, in the method for producing a composition containing silver fine particles of the present invention, after the reduction liquid preparation step, the silver reaction step, the washing step are performed, a step of dispersing the fine particles in a polar solvent is performed. The "dispersion" used herein indicates a state in which the fine particles exist stably in the polar solvent. After standing still, the fine particles may be partially precipitated. In addition, a dispersant may be added to a dispersion liquid so that nanoparticles are facilitated to be dispersed.

Such steps are performed to obtain a composition in which a dispersant and silver fine particle powders with a diameter of 100 nm or less are dispersed in the polar solvent.

In the method for producing silver fine particles and the method for producing a composition containing the same of the present invention as described above, a reaction vessel having such a shape and a structure that stirring is evenly performed may be used as a reaction vessel. The silver fine particles can be obtained by a reduction reaction, and such a reaction vessel may be used since local concentration and pH distributions influence the particle size distribution largely due to a very small size of particle to be obtained.

Subsequently, in one embodiment of the method for producing silver fine particles of the present invention, the respective production steps will be described along the flow of reaction.

<Liquid Preparation Step>

In this step, two kinds of liquids are provided. One liquid is a liquid I in which a substance having reductive properties is dissolved (referred to as a reduction liquid later), and another liquid is a liquid II in which a metal salt (particularly a silver salt) as a raw material is dissolved (referred to as a raw material liquid later). The reduction liquid is obtained by dissolving the reducing agent in pure water, adding each of the stabilizing agent and the aqueous ammonia as a protective agent, and mixing a solution evenly. Further, the raw material liquid is obtained by dissolving crystals of metal salt in pure water. Herein, depending on solubility of the protective agent, and the like, the order of addition can be changed as appropriate without any problem.

<Temperature Increase Step>

After the respective liquids are prepared, the temperatures of liquids are increased with a water bath or a heater to a reaction temperature. At this time, when the reduction liquid and the raw material liquid are heated in the same manner, a problem in which convection due to temperature difference prevents them from mixing at once can be avoided. In addition, there is an effect of preventing unevenness of the reaction due to the temperature difference so that the uniformity of particles can be kept. Accordingly, this temperature adjustment is preferable. A target temperature to be increased at this time (later reaction temperature) is within a range of 40 to 80° C.

<Reaction Step>

When the temperatures of liquids are both increased to the target temperature, the raw material liquid is added to the reduction liquid. From the viewpoint of uniformity of the reaction, it is preferable that the addition be performed at once with attention of bumping.

<Aging Step>

The reaction solution is mixed, and continuously stirred for about 10 to 30 minutes so as to complete the particle growth. The end point of the reaction at this time is determined by dropwise adding hydrazine to a sampled reaction liquid to confirm whether the non-reduced silver is reacted or not.

<Washing Step>

The resulting slurry is treated using a centrifuge separator to forcedly precipitate the particles, thereby performing solid-liquid separation. Centrifugal separation is performed at the number of revolutions of 3000 rpm for 30 minutes. After the solid-liquid separation, a supernatant is discarded, pure water is added, and the resultant solution is dispersed for 10 minutes with an ultrasonic dispersion apparatus. Steps of centrifugal separation, discarding of the supernatant, addition of pure water, and ultrasonic dispersion are repeated three times, whereby extra organic substances which adhere to the particles are removed.

<Drying Step>

An agglomerate of metal (agglomerate of silver) obtained is dried in air at 60° C. for 12 hours to obtain a dried agglomerate of metal particles.

<Conversion into Paste>

The agglomerate of metal particles obtained through the above-described method is added to a dispersing solvent as a polar solvent such as water, alcohol, polyol, glycol ether, 1-methylpyrrolidinone, pyridine, terpineol, butyl carbitol, butyl carbitol acetate, texanol, phenoxypropanol, diethylene glycol monobutyl ether, or diethylene glycol monobutyl ether acetate, to prepare a dispersion liquid.

It is suitable that substances which promote decrease in sintering temperature or cohesion are added to the above-described dispersion liquid, in some cases. These additive agents may have a viscosity adjusting function. The additive substances to be added at this time can be a water soluble resin or an aqueous dispersion resin. Specifically, a resin having a high acid value such as an acrylic resin, a maleic resin, a fumaric acid resin, and a styrene-maleic acid copolymer resin, a polyester resin, a polyolefin resin, a phenoxy resin, a polyimide resin, a polyamide resin, or vinyl acetate emulsion, acryl emulsion, synthetic rubber latex, an epoxy resin, a phenol resin, a DAP resin, a urethane resin, a fluorine resin, a silicone resin, ethylcellulose, polyvinylalcohol, and the like can be added. Examples of an inorganic binder include silica sol, alumina sol, zirconia sol, and titania sol. However, it is not preferable that such a resin be excessively added since the purity of metal is decreased. It is preferable that the amount of the resin be almost the amount of typical additive substances.

As specific names, the following products are known. As long as a material has the above-described properties, use of such a material other than those described in this paragraph is not eliminated. Examples thereof as an acrylic resin include BR-102, BR-105, BR-117, BR-118, BR-1122, MB-3058 (available from MITSUBISHI RAYON CO., LTD.), ARUFON UC-3000, ARUFON UG-4010, ARUFON UG-4070, ARUFON UH-2041, ARUFON UP-1020, ARUFON UP-1021, and ARUFON UP-1061 (available from TOAGOSEI CO., LTD.). Examples thereof as a polyester resin include VYLON 220, VYLON 500, VYLON UR1350 (available from TOYOBO CO., LTD.), and MALKYD No. 1 (available from ARAKAWA CHEMICAL INDUCTRIES, LTD.). Examples thereof as an epoxy resin include ADEKA RESIN EP-4088S, ADEKA RESIN EP-49-23 (available from ADEKA CORPORATION), and 871 (available from Japan Epoxy Resin Co., Ltd). Examples thereof as a phenol resin include RESITOP PL-4348, and RESITOP PL-6317 (available from GUN EI CHEMICAL INDUCTRY CO., LTD). Examples thereof as a phenoxy resin include 1256, 4275 (available from Japan Epoxy Resin Co., Ltd), and TAMANOL 340 (available from ARAKAWA CHEMICAL INDUCTRIES, LTD.). Examples thereof as a DAP resin include DAP A and DAP K (available from DAISO CO., LTD.). Examples thereof as an urethane resin include Millionate MS-50 (available from NIPPON POLYURETHANE INDUSTRY CO., LTD.). Examples thereof as ethylcellulose include ETHOCEL STANDARD 4, ETHOCEL STANDARD 7, ETHOCEL STANDARD 20, and ETHOCEL STANDARD 100 (available from NISSHIN KASE CO., LTD.). Examples thereof as polyvinyalcohol include RS-1713, RS-1717, and RS-2117 (available from KURARAY CO., LTD.).

Further, since the metal nanoparticles of the present invention are minute, the particles are likely to aggregate with each other. Therefore, it is preferable that a dispersant be added to disperse the particles. A commercially-available general-purpose dispersant is sufficient as long as it has properties of affinity to a particle surface and affinity to a dispersing solvent. In addition, a dispersant may be used alone or in combination with other dispersants.

Typical examples of the dispersant having such properties include low molecular weight anionic compounds such as fatty acid salts (soap), salts of a-sulfonated fatty acid ester (MES), alkylbenzenesulfonate (ABS), linear alkylbenzenesulfonate (LAS), alkylsulfate (AS), salts of alkyl ether sulfuric acid ester (AES), and triethanol alkyl sulfate, low molecular weight nonionic compounds such as fatty acid ethanol amide, polyoxyethylene alkyl ether (AE), polyoxyethylene alkyl phenyl ether (APE), sorbitol, and sorbitan, low molecular weight cationic compounds such as alkyltrimethylammonium salts, dialkyldimethyl ammonium chloride, and alkylpyridinium chloride, low molecular weight amphoteric compounds such as alkylcarboxyl betaine, sulfobetaine, and lecithin, high molecular weight aqueous dispersants typified by formalin condensates of naphthalene sulfonate, polystyrene sulfonate, polyacrylate, copolymer salts of vinyl compound and carboxylic acid monomer, carboxymethylcellulose, and polyvinylalcohol, high molecular weight non-aqueous dispersants such as partially alkyl-esterified polyacrylic acid and polyalkylene polyamine, and high molecular weight cationic dispersants such as polyethyleneimine and aminoalkyl methacrylate copolymer. Dispersants having a structure other than the shapes shown herein are not eliminated as long as they are suitably applied to the particles of the present invention.

As specific names, the following products are known as the dispersant. Examples thereof include Flowlen DOPA-15B, Flowlen DOPA-17 (available from KYOEISHA CHEMICAL Co., LTD), Solplus AX5, Solplus TX5, Solsperse 9000, Solsperse 12000, Solsperse 17000, Solsperse 20000, Solsperse 21000, Solsperse 24000, Solsperse 26000, Solsperse 27000, Solsperse 28000, Solsperse 32000, Solsperse 35100, Solsperse 54000, Sothix 250 (available from The Lubrizol Corporation), EFKA4008, EFKA4009, EFKA4010, EFKA4015, EFKA4046, EFKA4047, EFKA4060, EFKA4080, EFKA7462, EFKA4020, EFKA4050, EFKA4055, EFKA4400, EFKA4401, EFKA4402, EFKA4403, EFKA4300, EFKA4330, EFKA4340, EFKA6220, EFKA6225, EFKA6700, EFKA6780, EFKA6782, EFKA8503 (available from EFKA Additives), AJISPER PA111, AJISPER PB711, AJISPER PB821, AJISPER PB822, AJISPER PN411, FAMEX L-12 (available from Ajinomoto Fine-Techno Co., Inc.), TEXAPHOR-UV21, TEXAPHOR-UV61 (available from Cognis Japan Ltd.), DisperBYK101, DisperBYK102, DisperBYK106, DisperBYK108, DisperBYK111, DisperBYK116, DisperBYK130, DisperBYK140, DisperBYK142, DisperBYK145, DisperBYK161, DisperBYK162, DisperBYK163, DisperBYK164, DisperBYK166, DisperBYK167, DisperBYK168, DisperBYK170, DisperBYK171, DisperBYK174, DisperBYK180, DisperBYK182, DisperBYK192, DisperBYK193, DisperBYK2000, DisperBYK2001, DisperBYK2020, DisperBYK2025, DisperBYK2050, DisperBYK2070, DisperBYK2155, DisperBYK2164, BYK220S, BYK300, BYK306, BYK320, BYK322, BYK325, BYK330, BYK340, BYK350, BYK377, BYK378, BYK380N, BYK410, BYK425, BYK430 (available from BYK Japan KK), DISPARLON 1751N, DISPARLON 1831, DISPARLON 1850, DISPARLON 1860, DISPARLON 1934, DISPARLON DA-400N, DISPARLON DA-703-50, DISPARLON DA-725, DISPARLON DA-705, DISPARLON DA-7301, DISPARLON DN-900, DISPARLON NS-5210, DISPARLON NVI-8514L, HIPLAAD ED-152, HIPLAAD ED-216, HIPLAAD ED-251, HIPLAAD ED-360 (available from KUSUMOTO CHEMICALS, Ltd.), FTX-207S, FTX-212P, FTX-220P, FTX-220S, FTX-228P, FTX-710LL, FTX-750LL, FTERGENT 212P, FTERGENT 220P, FTERGENT 222F, FTERGENT 228P, FTERGENT 245F, FTERGENT 245P, FTERGENT 250, FTERGENT 251, FTERGENT 710FM, FTERGENT 730FM, FTERGENT 730LL, FTERGENT 730LS, FTERGENT 750DM, FTERGENT 750FM (available from NEOS COMPANY LIMITED), AS-1100, AS-1800, AS-2000 (available from TOAGOSEI CO., LTD.), KAOCER 2000, KAOCER 2100, KDH-154, MX-2045L, HOMOGENOL L-18, HOMOGENOL L-95, RHEODOL SP-010V, RHEODOL SP-030V, RHEODOL SP-L10, RHEODOL SP-P10 (available from Kao Corporation), EPAN U103, SHALLOL DC902B, NOIGEN EA-167, BLYSURF A219B, PLYSURF AL (available from DAI-ICHI KOGYO SEIYAKU CO., LTD.), MEGAFAC F-477, MEGAFAC 480SF, MEGAFAC F-482, (available from DIC Corporation), sylface SAG503A, Dynol 604 (available from Nissin Chemical Industry Co., Ltd.), SN-SPERSE 2180, SN-SPERSE 2190, SN-Leveller S-906 (available from SAN NOPCO LIMITED), S-386, and S420 (available from AGC SEIMI CHEMICAL CO., LTD.).

At this time, the amount of the dispersant to be added is 5.0% by mass or less with respect to the total amount, preferably 1.0% by mass or less, and more preferably 0.5% by mass or less. When the addition amount is less than 0.1% by mass, an addition effect is not available, and nanoparticles aggregate with each other in the solution. Therefore, it is not preferable. When 5.0% by mass or more of dispersant is added, a pre-firing portion may remain during bonding, and therefore it is not preferable.

In addition, during the preparation of the dispersion liquid, appropriate mechanical dispersing treatments can also be used. As the mechanical dispersing treatment, any known methods can be employed under conditions without remarkable reformulation in particles. Specific examples thereof include ultrasonic dispersion, a disper, a three-roll mill, a ball mill, a bead mill, a biaxial kneader, a rotary and revolutionary stirrer, and the like. These can be used alone or two or more of these can be used.

Next, the bonding method will be described in detail. According to the bonding method of the present invention, the object to be bonded is not particularly affected by the materials. However, in view of the characteristics of the present method, it is desirable that the material be one capable of bearing local pressure. For example, a ceramic, a metal plate, and the like are exemplified. Further, a ceramic or a metal plate having a surface subjected to various plating can suitably be used.

In addition, as the general bonding, it is important that a bonding face is kept clean to secure the wettability when the metal nanoparticles return to a bulk material.

[Pressure Bonding (Adhesion) Step]

The bonding material obtained through the above-described steps is applied to an adherend, and heated while a pressure is applied above and below the bonding material, whereby the bonding material on the metal adherend is converted into metal. The pressure to be applied may be high as long as bonding substances are not destroyed.

<Preliminary Heating Step>

Next, under pressure, the whole object is heated at less than 150° C., and more preferable less than 100° C. This heating is to evaporate the solvent in the bonding material. Accordingly, it is preferable that the whole object to be adhered be heated at a temperature higher than the boiling point of the solvent used in the bonding material. A heating time depends on a heating temperature, and may be 30 seconds to 30 minutes.

<Firing Step>

The bonding material obtained through the above-described steps is applied to an adherend. A specimen is mounted thereon, and the bonding material is pressurized at a pressure of 0.5 N. Then they are dried at 100° C. for 10 minutes, and heated at 350° C. for 5 minutes while a pressure of 10 N is applied above and below the bonding material to convert the bonding material on the metal adherend into metal.

<Evaluation of Adhesion Strength>

The adhesion strength was determined in accordance with a method described in "Test methods for lead-free solders—Part 5: Methods for tensile tests and shear tests on solder joints" in JIS Z 03918-5:2003. That is, this method is for calculating a force when a bonding body obtained by die bonding is pushed horizontally, and thereby does not bear the pushed force to break the bonding face. As the specimen, a copper chip having a size of 2 mm square was used. In the present examples, a bond tester manufactured by DAGE is used to perform the tests. Measurement is performed at a shear height of 200 μm, a test rate of 5 mm/min, and room temperature.

<Evaluation of Average Primary Particle Diameter>

Two parts by mass of washed nanoparticles were added to a mixture solution of 96 parts by mass of cyclohexane and 2 parts by mass of oleic acid and dispersed with ultrasonic waves. The dispersed solution was added dropwise to a copper microgrid with a supporting film and dried to obtain a TEM sample. Particles on the formed microgrid were observed with a transmission electron microscopy (manufactured by JEOL Ltd, JEM-100CX Mark-II) at an accelerating voltage of 100 kV in a bright field, and the observed image was photographed at 300,000-fold magnification.

The average primary particle diameter was calculated with an image analysis software (manufactured by Asahi Kasei Engineering Corporation, A-ZO KUN (registered trademark)). This image analysis software can distinguish each particle by shading. A TEM image of 300,000-fold magnification was subjected to circular particle analysis under conditions of "dark" in "particle brightness," "presence" in "noise removing filter," "20" in "circular threshold value," and "50" in "overlapping degree," to measure primary particle diameters of 200 or more particles, and the number average particle diameter was determined. Herein, when there were many condensate particles and heteromorphy particles in the TEM image, this was considered as "not measurable."

Hereinafter, the performance of the bonding material of the present invention will be described by use of the results of Examples.

EXAMPLES (Production of Silver Nanoparticles)

Silver nanoparticles commonly used in the present examples were produced as follows. A 5-L reaction vessel was used as a reaction vessel. Further, a stirrer shaft with blades was provided at the center of the reaction vessel for stirring. The reaction vessel was equipped with a thermometer is for monitoring temperatures and a nozzle so as to supply nitrogen to a solution from a lower part.

3400 g of water was first put into the reaction vessel, and nitrogen was passed at a flow rate of 3000 mL/min for 600 seconds from the lower part of the reaction vessel to remove remained oxygen. After then, nitrogen was supplied at a flow rate of 3000 mL/min from the upper part of the reaction vessel to create a nitrogen atmosphere inside the reaction vessel. The solution temperature in the reaction vessel was adjusted while stirring so as to become 60° C. Then, 7 g of aqueous ammonia to be a content of ammonia of 28% by mass was put in the reaction vessel, and then was stirred for 1 minute so that the solution was uniform.

45.5 g of hexanoic acid (available from Wako Pure Chemical Industries, Ltd.) (the molar ratio with respect to silver was 1.98) was then added as a protective agent, and the solution was stirred for 4 minutes to dissolve the protective agent. After then, 23.9 g of aqueous solution of 50% by mass hydrazine hydrate (available from Otsuka Chemical Co., Ltd.)(4.82 equivalents with respect to silver) was added as a reducing agent to obtain a reducing agent solution.

An aqueous solution of silver nitrate obtained by dissolving 33.8 g of silver nitrate crystal (available from Wako Pure Chemical Industries, Ltd.) in 180 g of water was prepared in another vessel to obtain a silver salt aqueous solution. Further, 0.00008 g of copper nitrate trihydrate (available from Wako Pure Chemical Industries, Ltd.) (1 ppm with respect to silver based on the pure copper) was added to the silver salt aqueous solution. Since the amount cannot be measured with a commercially available weighing balance, the addition of copper nitrate trihydrate was performed by producing an aqueous solution of copper nitrate trihydrate having a relatively high concentration, diluting the solution, and adding the diluted solution so that copper only in a desired addition amount was added. In addition, the temperature of the silver salt aqueous solution was adjusted to 60° C. which was the same as in the reducing agent solution in the reaction vessel.

After then, the silver salt aqueous solution was added at once to the reducing agent solution and thus mixed, and a reduction reaction was initiated. At this time, variation in to the color of slurry was stable in about 10 seconds after the initiation of the reduction reaction. The solution was continuously stirred, and was aged for 10 minutes as it was. Then, stirring was stopped, and vacuum filtration was used to separate a solid from a liquid. The solid was washed with pure is water, and dried at 40° C. for 12 hours to obtain silver fine particle powder. The ratio of silver in the powder at this time was calculated from a confirmation test of remained amount after heating, to be 97% by mass. It is considered that a remainder includes hexanoic acid or a derivative thereof.

In the present examples, examples using not only hexanoic acid but also sorbic acid as a protective agent were also prepared. Specifically, silver fine particle powder was obtained in the same manner as in the case of using hexanoic acid, except that 44.78 g of sorbic acid (available from Wako Pure Chemical Industries, Ltd.) was used instead of hexanoic acid as the protective agent during the production of the above-described silver nanoparticles. The ratio of silver in the powder at this time was calculated, to be 99% by mass. It is considered that a remainder includes sorbic acid or a derivative thereof.

Example 1

80 g of the obtained powder of silver particles coated with hexanoic acid (average particle diameter: 13.9 nm, X-ray crystal particle diameter (observed using Co Kα X-ray from a Co tube of an X-ray diffraction apparatus manufactured by Rigaku Corporation: RINT-2100, and calculated from the Ag (111) diffraction line using Scherrer equation): 9.6 nm) was mixed with 15 g of terpineol (mixture of structure isomers/available from Wako Pure Chemical Industries, Ltd.), and 5 g of DisperBYK (registered trademark)-2020(available from BYK Japan KK) as a humectant dispersant to produce a bonding material. The obtained bonding material was applied to a glass substrate by a printing method. As this condition, a metal mask (mask thickness: 50 μmt) was used, and a metal squeegee was manually operated.

Figure 3:
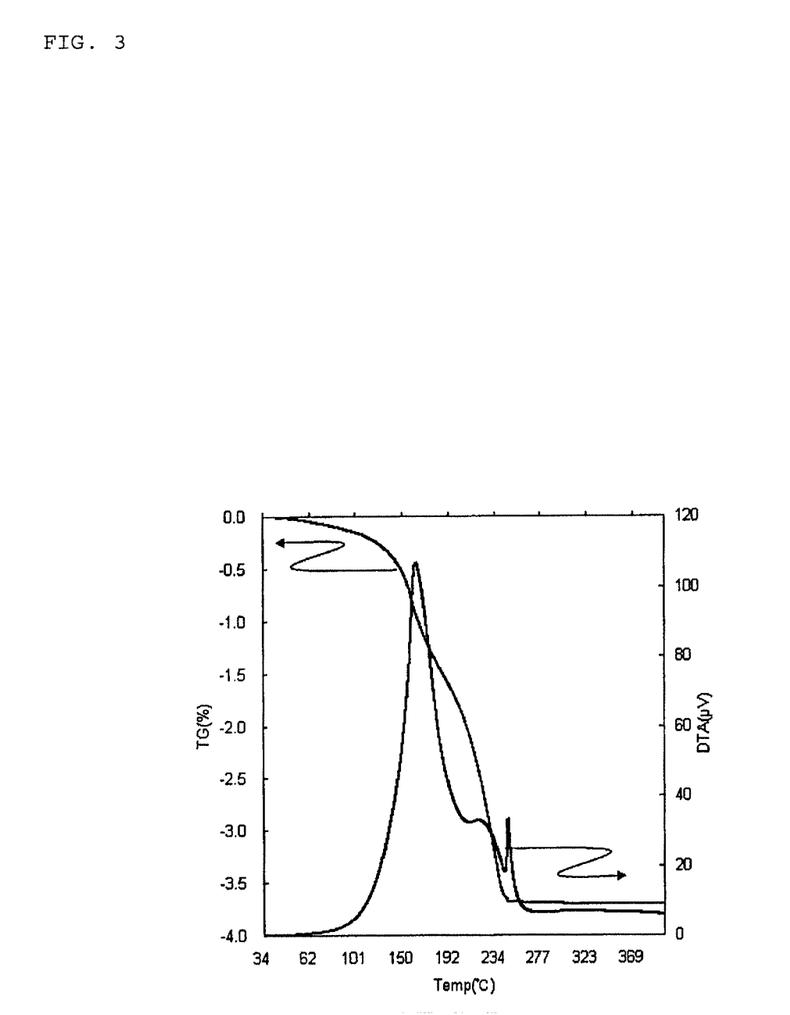
FIG. 3 is a TG-DTA chart of metal nanoparticles used in Example 1.

FIG. 3 shows a TG chart of the particles. As a measurement apparatus, a thermogravimetry/differential thermal analyzer EXSTAR TG/DTA6300 manufactured by SII NanoTechnology Inc. was used. A measurement condition was a temperature-increase rate of 10° C./min in air. A horizontal axes shows temperatures, a left longitudinal axes shows a weight change curve (TG curve), and a right longitudinal axes shows a differential thermal curve (DTA curve). A sintering point is at the end of decline in the TG curve and a peak value of the DTA curve. Thus, the sintering point of the particles was determined to 171° C.

Then, as the preliminary heating step, heating at 100° C. in an air atmosphere for 10 minutes was performed. The temperature was increased from 100° C. to the temperature of main firing (350° C.) at a temperature-increase rate of 3.0° C./s, and after it reached 350° C., the main firing step was performed for 5 minutes. In the present example, an obtained bonding layer was one which was burned uniformly and had metallic luster.

A bonding test of an oxygen-free copper substrate and a copper chip was performed using the obtained bonding material. The bonding material of the present invention was applied to the bottom of a metal piece, and the metal piece was disposed on the copper substrate. Then, through the pressure-bonding step described above, a bonding body was produced. The obtained bonding body was evaluated by a die shear test. The obtained bonding strength is shown in Table 1.

Example 2

A bonding material was produced in the same manner as in Example 1 except that the mass ratio of the powder of silver particles coated with hexanoic acid, terpineol, and the dispersant was changed into 90:8.6:1.4. Then, the bonding strength was measured under the same conditions as in Example 1. The obtained results are also shown in Table 1.

Example 3

A bonding material was produced in the same manner as in Example 1 except that the mass ratio of the powder of silver particles coated with hexanoic acid, terpineol, and the dispersant was changed into 80:18.6:1.4. Then, the bonding strength was measured under the same conditions as in Example 1. The obtained results are also shown in Table 1.

Example 4

Figure 4:
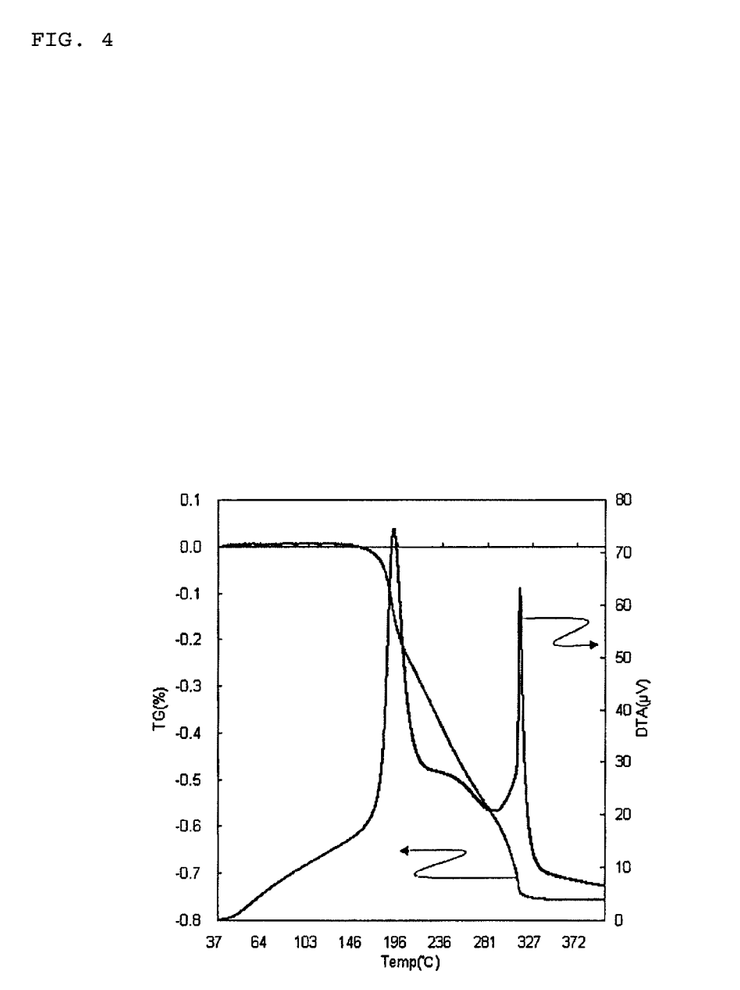
FIG. 4 is a TG-DTA chart of metal nanoparticles used in Example 4.

Instead of the powder of silver particles coated with hexanoic acid, a powder of silver particles coated with sorbic acid (average particle diameter: 35.7 nm, X-ray crystal particle diameter/Ag (111): 30.2 nm) (herein, FIG. 4 shows a TG chart of the particles, thereby determining the sintering point of the particles to 194° C.) was used. A bonding material was produced in the same manner as in Example 1 except that the mass ratio of the powder of silver particles coated with sorbic acid, terpineol, and the dispersant was changed into 90:8.6:1.4. Then, the bonding strength was measured under the same conditions as in Example 1. The obtained results are also shown in Table 1. Further, the bonding material had luster, and it is confirmed to be a bonding material excellent in malleability.

Example 5

A bonding material was produced in the same manner as in Example 1 except that the mass ratio of the powder of silver particles coated with sorbic acid, terpineol, and the dispersant was changed into 90:9.3:0.7. Then, the bonding strength was measured under the same conditions as in Example 1. The obtained results are also shown in Table 1.

Example 6

A silver nanoparticle bonding material in which the ratio of the powder of silver particles coated with hexanoic acid, the powder of silver particles coated with sorbic acid, terpineol, and the dispersant was 45:45:8.6:1.4 was produced, and a bonding material was produced in the same manner as in Example 1. Then, the bonding strength was measured under the same conditions as in Example 1. The obtained results are also shown in Table 1.

Comparative Example 1

Instead of metal nanoparticle powder, spherical silver powder (silver microparticles) having an average particle diameter of 0.60 µm was used to produce a bonding material in a ratio of the spherical silver powder, terpineol, and the dispersant of 90:8.6:1.4. Then, the bonding strength was measured under the same conditions as in Example 1. The obtained results are also shown in Table 1.

Comparative Example 2

The objects to be bonded were bonded using a commercially available high-temperature lead solder paste (SN515 RMA A M Q M-293T available from Nihon Superior Co., Ltd.). The bonding method is the same manner as in examples. The preliminary heating step was performed at 150° C. for two minutes, and the firing step was performed at 350° C. for 40 seconds. The obtained results are also shown in Table 1.

Comparative Example 3

The objects to be bonded were bonded using a commercially available lead-free solder paste (M705-K2-V available from Senju Metal Industry Co., Ltd.). The bonding method is the same manner as in Examples. The preliminary heating step was performed at 150° C. for 2 minutes, and the firing step was performed at 250° C. for 40 seconds. The obtained results are also shown in Table 1.

With reference to Table 1, in the adhesion strength test by the die shear test method, the bonding strengths using the solder in Comparative Examples 2 and 3 are considered as one standard. The bonding strengths of lead solder and lead-free solder are 36.7 MPa and 40.0 MPa, respectively. Further, in Comparative Example 1, the bonding material was produced using silver microparticles, and the bonding strength was as very small as 2.8 MPa. Although the material is silver that is the same as the invention and the microparticles become a bulk material at a firing temperature of 350° C., the bonding strength in the bonding interface is not said to be sufficient.

On the other hands, in examples other than Example 1 (32.7 MPa), the bonding strength higher than that in the case of the solder which is a target for comparison can be obtained. In particular, in Example 5 using a paste in which the surface of silver nanoparticles was coated with sorbic acid being an unsaturated fatty acid, the bonding strength as high as 49.7 MPa was obtained. Further, in Example 6 in which the powder of particles coated with sorbic acid and the powder of particles coated with hexanoic acid were mixed half and half, the bonding strength as further high as 50.4 MPa was obtained.

Figure 2:
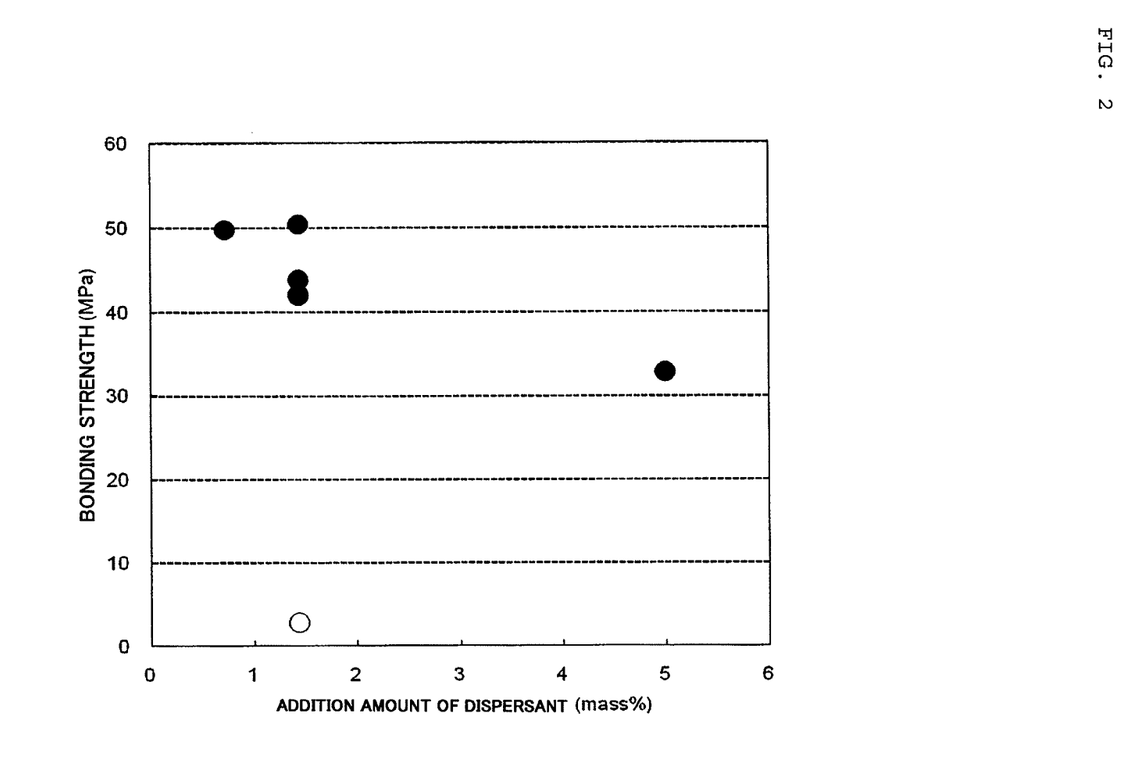
FIG. 2 is a graph showing a relationship between a dispersant and adhesion strength.

FIG. 2 is a graph showing a relationship between a percent by mass of a dispersant (DisperBYK-2020) and the bonding strength. A longitudinal axes shows the bonding strength (MPa), and a horizontal axes shows the addition amount (% by mass) of a dispersant. Further, Examples 1 to 6 are shown as black circles, and Comparative Example 1 is shown as a white circle. A zone of oblique line between about 37 MPa and 40 MPa shows bonding strength of a solder. As shown by black circles representing Examples of the subject application, as the addition amount of a dispersant is increased, it is confirmed that the bonding strength is decreased. It is estimated from the tendency that when the addition amount of a dispersant is about 3% by mass or more, the bonding strength is equal to or less than that of a solder. Accordingly, in Example 1 using the bonding material of the present invention, since the addition amount of the dispersant is as large as 5.0% by mass, it is considered that the bonding strength is comparatively small.

Further, in the present Examples, a bonding material was applied to a bonding face of an object to bonded, and was heated under pressure. Bubbles generated due to the decomposition of organic substances and the like may be removed when fired metal nanoparticles are melted, and therefore a method including applying a bonding material to a bonding

TABLE 1

| | PASTE COMPOSITION (MASS RATIO: %) | | | | | BONDING |
| | SILVER PARTICLES COATED WITH HEXANOIC ACID | SILVER PARTICLES COATED WITH SORBIC ACID | SPHERICAL SILVER POWDER | TERPINEOL | Disper-BYK 2020 | STRENGTH (MPa) |
| --- | --- | --- | --- | --- | --- | --- |
| EXAMPLE 1 | 80 | — | — | 15.0 | 5.0 | 32.7 |
| EXAMPLE 2 | 90 | — | — | 8.6 | 1.4 | 42.1 |
| EXAMPLE 3 | 80 | — | — | 18.6 | 1.4 | 41.9 |
| EXAMPLE 4 | — | 87 | — | 11.6 | 1.4 | 43.8 |
| EXAMPLE 5 | — | 87 | — | 12.3 | 0.7 | 49.7 |
| EXAMPLE 6 | 45 | 45 | — | 8.6 | 1.4 | 50.4 |
| COMPARATIVE EXAMPLE 1 | — | — | 90 | 8.6 | 1.4 | 2.8 |
| COMPARATIVE EXAMPLE 2 | COMMERCIALLY AVAILABLE LEAD SOLDER | | | | | 36.7 |
| COMPARATIVE EXAMPLE 3 | COMMERCIALLY AVAILABLE LEAD-FREE SOLDER | | | | | 40.0 | face of an object to be bonded, not allowing the bonding faces to butt each other, performing drying or preliminary heating at a temperature equal to or lower than the firing temperature to dry the bonding face, and making the bonding faces butt each other and heating them is employed.

INDUSTRIAL APPLICABILITY

The bonding according to the present invention can be applied to a non-insulating semiconductor apparatus, bear chip mounting assembly technique, and a bonding step in manufacturing a power device (a rectifier diode, a power transistor, a power MOSFET, an insulating gate bipolar transistor, a thyristor, a gate turnoff thyristor, and a triac). Further, the bonding material can be used on a glass having a chrome-finished surface, and be used as a bonding material for electrodes or frame of illuminating apparatus using LEDs.

The invention claimed is:

1. A bonding material comprising:
   metal nanoparticles and
   a polar solvent in an amount of 5 to 20% by mass with respect to the metal;
   wherein the metal nanoparticles have an average particle diameter of 100 nm or less, at least one of the metal nanoparticles is surface coated with an unsaturated fatty acid having 6 to 8 carbon atoms, and at least one of the metal nanoparticles is surface coated with a saturated fatty acid having 6 to 8 carbon atoms.

2. The bonding material according to claim 1, further comprising a dispersant added thereto.

3. The bonding material according to claim 1, wherein the unsaturated fatty acid having 6 to 8 carbon atoms is sorbic acid and the saturated fatty acid having 6 to 8 carbon atoms is hexanoic acid.

4. A bonding method comprising:
   applying a bonding material to either or both of an adherend and a face to be adhered,
   wherein the bonding material comprises metal nanoparticles and a polar solvent in an amount of 5 to 20% by mass with respect to the metal nanoparticles
   and wherein the metal nanoparticles have an average particle diameter of 100 nm or less, at least one of the metal nanoparticles is surface coated with an unsaturated fatty acid having 6 to 8 carbon atoms, and at least one of the metal nanoparticles is surface coated with a saturated fatty acid having 6 to 8 carbon atoms,
   performing heating at a temperature equal to or lower than a sintering temperature of the metal nanoparticles while an object to be adhered is brought into contact with the adherend under pressure, and
   performing heating at a heating temperature of 200° C. or higher and 350° C. or lower.

5. The bonding method according to claim 4, wherein
   a retention time in the first heating step is 30 seconds or more and 30 minutes or less, and
   a retention time in the second heating step is 30 seconds or more and 60 minutes or less.

6. The bonding method according to claim 4, wherein the metal nanoparticle is a silver nanoparticle.

7. A bonding method comprising:
   applying a bonding material to a bonding face and a face to be bonded,
   wherein the bonding material comprises metal nanoparticles and a polar solvent in an amount of 5 to 20% by mass with respect to the metal nanoparticles
   and wherein the metal nanoparticles have an average particle diameter of 100 nm or less, at least one of the metal nanoparticles is surface coated with an unsaturated fatty acid having 6 to 8 carbon atoms, and at least one of the metal nanoparticles is surface coated with a saturated fatty acid having 6 to 8 carbon atoms,
   drying the bonding face and the face to be bonded at a temperature equal to or lower than a sintering temperature of the metal nanoparticles, and
   making the bonding face butt the face to be bonded and heating them at 200° C. or higher and 350° C. or lower under pressure.

* * * * *